US012261169B2

(12) United States Patent
Lee et al.

(10) Patent No.: US 12,261,169 B2
(45) Date of Patent: Mar. 25, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Kuo-Hsing Lee, Hsinchu County (TW); Sheng-Yuan Hsueh, Tainan (TW); Chih-Kai Kang, Tainan (TW); Chun-Hsien Lin, Tainan (TW); Chi-Horn Pai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 428 days.

(21) Appl. No.: 17/732,570

(22) Filed: Apr. 29, 2022

(65) Prior Publication Data

US 2023/0317715 A1   Oct. 5, 2023

(30) Foreign Application Priority Data

Apr. 1, 2022 (CN) .......................... 202210356920.1

(51) Int. Cl.
| H01L 27/06 | (2006.01) |
| H01L 21/8238 | (2006.01) |
| H01L 29/66 | (2006.01) |
| H01L 29/78 | (2006.01) |
| H01L 29/94 | (2006.01) |

(52) U.S. Cl.
CPC .. *H01L 27/0629* (2013.01); *H01L 21/823821* (2013.01); *H01L 21/823864* (2013.01); *H01L 29/66181* (2013.01); *H01L 29/7851* (2013.01); *H01L 29/94* (2013.01)

(58) Field of Classification Search
CPC ......... H01L 27/0629; H01L 21/823821; H01L 21/823864; H01L 29/66181; H01L 29/7851; H01L 29/94; H01L 27/0924; H01L 21/823412; H01L 21/823418; H01L 27/0922
See application file for complete search history.

(56) References Cited

U.S. PATENT DOCUMENTS

| 2005/0218455 A1* | 10/2005 | Maeda ............ H01L 21/823807 257/E27.064 |
| 2018/0026112 A1* | 1/2018 | Park ...................... H01L 29/785 257/369 |
| 2018/0076145 A1* | 3/2018 | Goktepeli ............... H01L 27/13 |
| 2020/0203344 A1* | 6/2020 | Wang .................... H01L 29/161 |
| 2021/0050300 A1* | 2/2021 | Lin ..................... H01L 23/5383 |

* cited by examiner

*Primary Examiner* — Karen Kusumakar
*Assistant Examiner* — Adam S Bowen
(74) *Attorney, Agent, or Firm* — Winston Hsu

(57) ABSTRACT

A method for fabricating a semiconductor device includes the steps of first providing a substrate having a first NMOS region, a first PMOS region, a second NMOS region, a second PMOS region, and a MOS capacitor region, forming a fin NMOS transistor on the first NMOS region, forming a fin PMOS transistor on the first PMOS region, forming a planar NMOS transistor on the second NMOS region, forming a planar PMOS transistor on the second PMOS region, and forming a planar MOS capacitor on the MOS capacitor region.

7 Claims, 6 Drawing Sheets

SEMICONDUCTOR DEVICE AND METHOD FOR FABRICATING THE SAME

BACKGROUND OF THE INVENTION

1. Field of the Invention

The invention relates to a method of fabricating semiconductor device, and more particularly to a method of integrating fin field effect transistor (FinFET) and planar low noise device.

2. Description of the Prior Art

As technology evolves, wireless communication is an important part of human life. Various electronic devices, such as smart phones, smart wearable devices, tablets, etc., utilize wireless radio frequency (RF) systems to transmit and receive wireless signals. A low noise amplifier (LNA) and a power amplifier (PA) are necessary amplifying circuits in the wireless RF system. In order to achieve better performance (e.g., linearity), the amplifying circuit requires an appropriate bias point. A common way is to electrically connect a biasing module to the amplifying circuit, so as to utilize the biasing module for providing a bias point for the amplifying circuit.

Nevertheless, the design and performance of transistors in device such as low noise amplifier has found to be insufficient parameters such as gate resistance, gate to body capacitance, and min noise figure. Since these parameters play a significant role in low noise amplifiers today, how to provide a better architecture for the transistors for improving the performance of the device has become an important task in this field.

SUMMARY OF THE INVENTION

A method for fabricating a semiconductor device includes the steps of first providing a substrate having a first n-type metal-oxide semiconductor (NMOS) region, a first p-type metal-oxide semiconductor (PMOS) region, a second NMOS region, a second PMOS region, and a MOS capacitor region, forming a fin NMOS transistor on the first NMOS region, forming a fin PMOS transistor on the first PMOS region, forming a planar NMOS transistor on the second NMOS region, forming a planar PMOS transistor on the second PMOS region, and forming a planar MOS capacitor on the MOS capacitor region.

According to another aspect of the present invention, a semiconductor device includes a fin NMOS transistor on a substrate, a fin PMOS transistor on the substrate, and a low noise device on the substrate. Preferably, the low noise device includes a planar NMOS transistor on the substrate and a planar PMOS transistor on the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
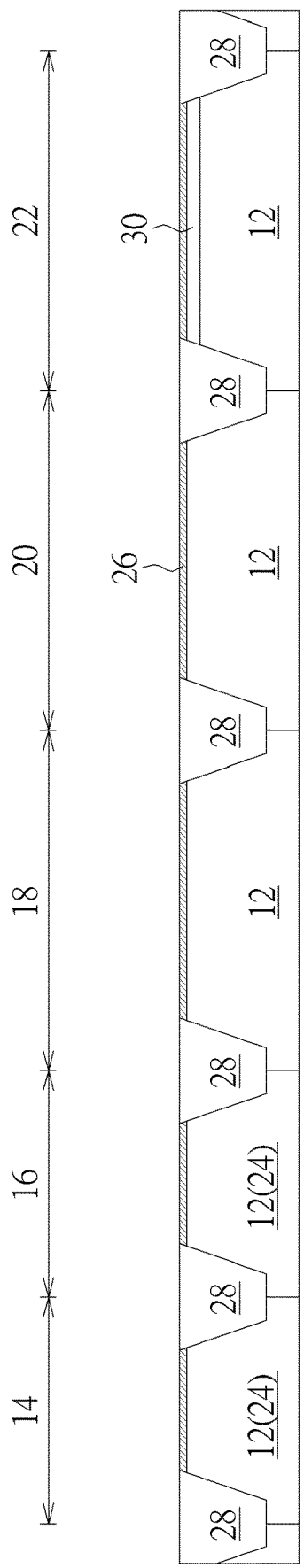
FIGS. 1-12 illustrate a method for fabricating a semiconductor device according to an embodiment of the present invention.

Referring to FIGS. 1-12, FIGS. 1-12 illustrate a method for fabricating a semiconductor device according to an embodiment of the present invention. As shown in FIG. 1, a substrate 12, such as a silicon substrate or silicon-on-insulator (SOI) substrate is provided and a logic device is disposed on the core of the substrate 12 while a low noise device is disposed around the logic device. Preferably, the logic device further includes a first NMOS region 14 and a first PMOS region 16 and the low noise device includes a second NMOS region 18, a second PMOS region 20, and a MOS capacitor region 22. In contrast to the first NMOS region 14 and the first PMOS region 16 are defined to fabricate FinFET devices in the later process, the second NMOS region 18, the second PMOS region 20, and the MOS capacitor region 22 are defined to fabricate planar devices including planar MOS transistors and planar MOS capacitors. Preferably, it would be desirable to first conduct an implantation process to form p-type deep wells in the substrate 12 of the first NMOS region 14, the second NMOS region 18, and the MOS capacitor region 22 and n-type deep wells in the substrate 12 of the first PMOS region 16 and second PMOS region 20.

Next, fin-shaped structures, active regions, and shallow trench isolation (STI) are formed on the aforementioned regions. For instance, a plurality of fin-shaped structures 24 are formed on the substrate 12 of the first NMOS region 14 and first PMOS region 16 respectively. Preferably, the fin-shaped structures 24 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 24 could also be obtained by first forming a patterned mask (not shown) on the substrate, 12, and through an etching process, the pattern of the patterned mask is transferred to the substrate 12 to form the fin-shaped structures 24. Moreover, the formation of the fin-shaped structures 24 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 24. These approaches for forming the fin-shaped structures 20 are all within the scope of the present invention.

In this embodiment, at least a liner 26 could be formed on each of the fin-shaped structures 24 during the aforementioned patterning process, in which the liner 26 preferably includes silicon oxide ($SiO_2$). It should be noted that even though a single liner 26 is disclosed in this embodiment, according to other embodiment of the present invention, the liner 26 disposed on the surface of fin-shaped structures 24 and substrate 12 could be a single-layer or multi-layer liner structure, in which the liner structure could include $SiO_2$, SiN, or combination thereof, which are all within the scope of the present invention.

Preferably, it would be desirable to conduct a photo-etching process to remove part of the substrate 12 between the aforementioned regions for forming trenches (not shown), conduct a flowable chemical vapor deposition (FCVD) process to form an insulating layer made of oxide such as $SiO_2$ in the trenches, and then conduct a planarizing process such as chemical mechanical polishing (CMP) process for removing part of the insulating layer so that the top surface of the remaining insulating layer is even with the top surface of the liner 26. The remaining insulating layer at this stage preferably forms a shallow trench isolation (STI) 28 between the aforementioned regions.

Next, an ion implantation process could be conducted on the surface of the substrate 12 on the MOS capacitor region 22 for forming a doped region 30, in which the doped region 30 preferably serves as a channel or bottom electrode for the MOS capacitor formed afterwards and the conductive type of the doped region 30 is preferably opposite to the well region within the substrate 12. For instance, the substrate 12 on the MOS capacitor region 22 includes a p-well while the doped layer 30 on the surface of the substrate 12 includes a n-type doped region, but not limited thereto.

Figure 2:
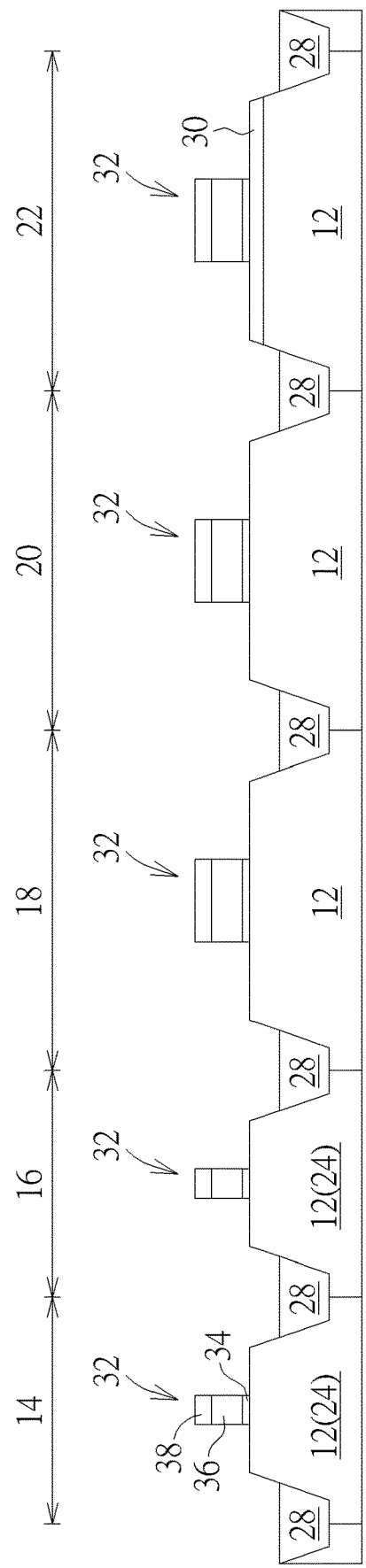

Next, as shown in FIG. 2, an etching process could be conducted to remove the liner 26 and part of the STI 28 so that the top surface of the STI 28 is slightly lower than the top surface of the substrate 12. Preferably, the top surface of the STI 28 on the FinFET device regions including the first NMOS region 14 and first PMOS region 16 is even within the top surface of STI 28 on the planar device regions including the second NMOS region 18, the second PMOS region 20, and the MOS capacitor region 22. Next, gate structures 32 or dummy gates are formed on the substrate 12 of the first NMOS region 14, the first PMOS region 16, the second NMOS region 18, the second PMOS region 20, and the MOS capacitor region 22.

In this embodiment, the formation of the dummy gates or gate structures 32 could be accomplished by sequentially forming a gate dielectric layer 34, a gate material layer 36, and a selective hard mask 38 on the substrate 12, conducting a pattern transfer process by using a patterned resist (not shown) as mask to remove part of the hard mask 38, part of the gate material layer 36, and part of the gate dielectric layer 34 through single or multiple etching processes, and then stripping the patterned resist for forming dummy gates or gate structures 32 each made of a patterned gate dielectric layer 34, a patterned gate material layer 36, and a patterned hard mask 38 on the substrate of the first NMOS region 14, the first PMOS region 16, the second NMOS region 18, the second PMOS region 20, and the MOS capacitor region 22. In this embodiment, the gate dielectric layer 34 could include $SiO_2$, the gate material layer 34 could include polysilicon, and the hard mask 38 could include silicon oxide or silicon nitride, but not limited thereto.

Figure 3:
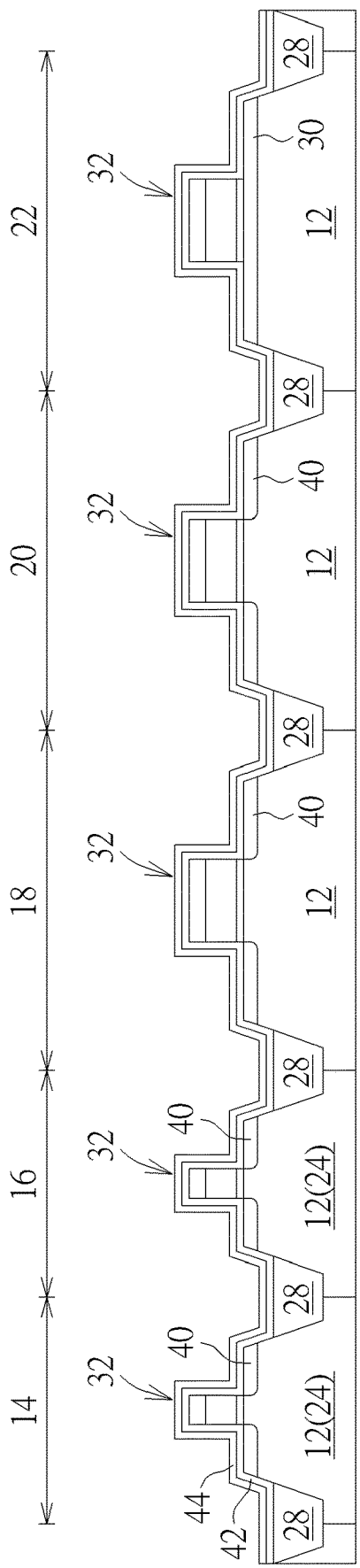

Next, as shown in FIG. 3, more than one ion implantation process could be conducted to form lightly doped drains (LDDs) 40 in the substrate 12 or fin-shaped structures 24 adjacent to the gate structures 32 on each region, in which the LDDs 40 preferably include corresponding dopants according to the type of device fabricated in each region. For instance, the LDDs 40 on the first NMOS region 14, the second NMOS region 18, and the MOS capacitor region 22 preferably include n-type dopants while the LDDs 40 on the first PMOS region 16 and second PMOS region 20 include p-type dopants. It should be noted that since a n-type doped region 30 is formed on the surface of the substrate 12 on MOS capacitor region 22 in the beginning, the concentration or position of the doped region 30 preferably remains unchanged even after the ion implantation for the LDDs 40 is conducted.

Next, a mask layer 42 and another mask layer 44 are formed on the gate structures 32 and substrate 12 and the surface of the STI 28. Preferably, the mask layer 42 includes silicon carbon nitride (SiCN), the mask layer 44 includes silicon nitride (SiN), the thickness of the mask layer 42 is between 140-160 Angstroms or most preferably 150 Angstroms, and the thickness of the mask layer 44 could be between 40-60 Angstroms or most preferably 50 Angstroms, but not limited thereto.

Figure 4:
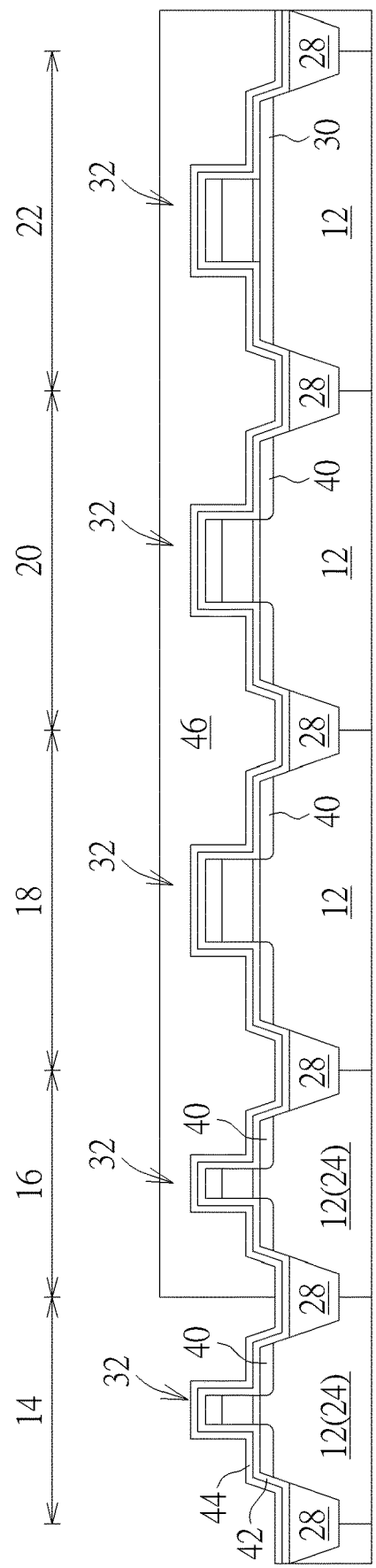

Next, as shown in FIG. 4, a patterned mask 46 such as a patterned resist is formed on the first PMOS region 16, the second NMOS region 18, the second PMOS region 20, and the MOS capacitor region 22, in which the patterned mask 46 includes an opening exposing the surface of the mask layer 44 on the first NMOS region 14.

Figure 5:
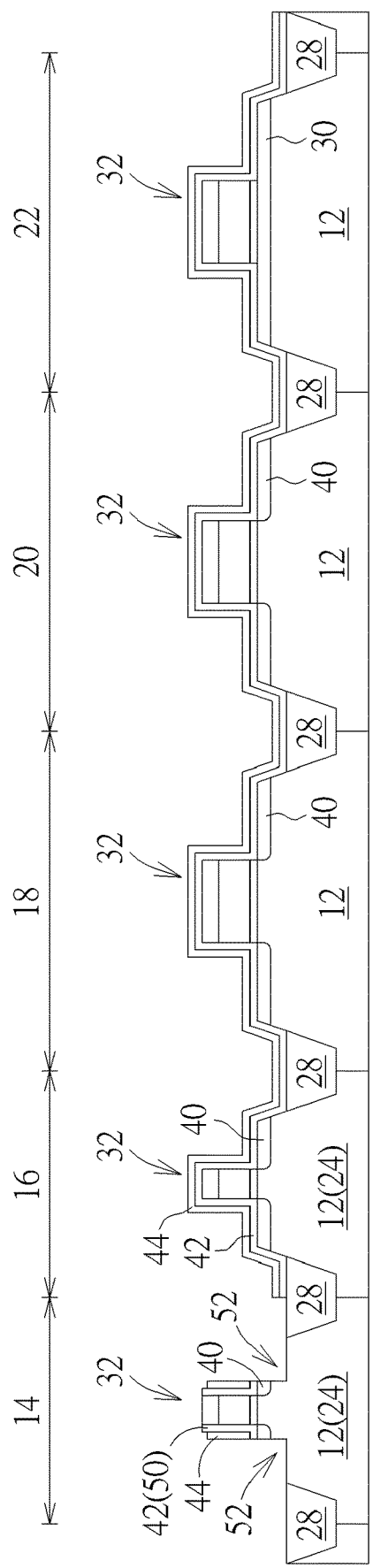

Next, as shown in FIG. 5, one or more dry etching and/or wet etching process is conducted by using the patterned mask 46 as mask to remove part of the mask layer 44, part of the mask layer 42, and part of the substrate 12 or fin-shaped structure 24 on the first NMOS region 14 for forming a spacer 50 on sidewalls of the gate structure 32 and recesses 52 adjacent to two sides of the spacer 50, and the patterned mask 46 is removed thereafter. Preferably, the mask layer 42 or spacer 50 at this stage includes a L-shape cross-section while the mask layer 44 includes an I-shape cross-section.

Figure 6:
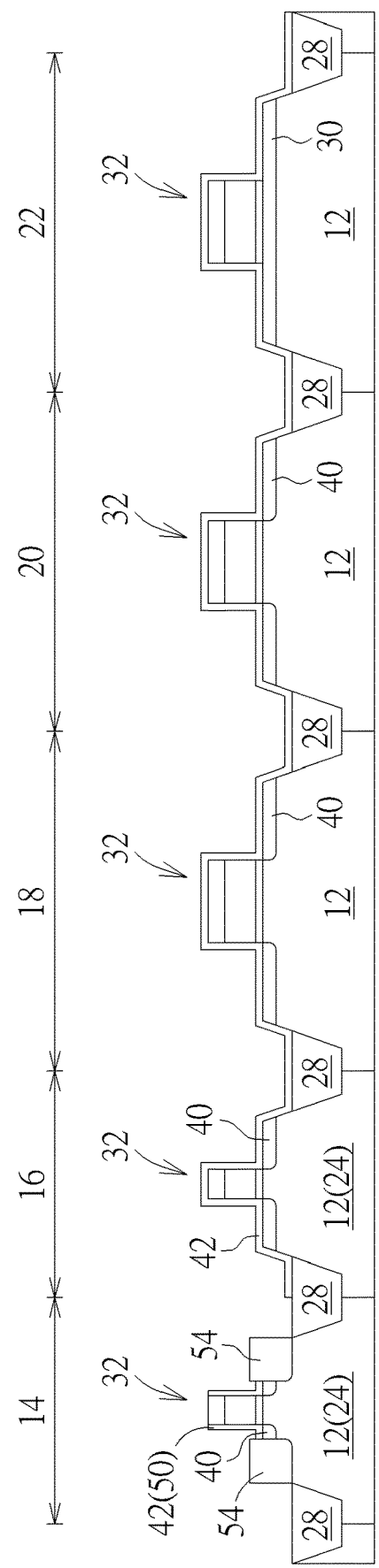

Next, as shown in FIG. 6, a selective epitaxial growth (SEG) process is conducted to form an epitaxial layer 54 made of silicon phosphide (SiP) in the recesses 52 for serving as a source/drain region. Next, another etching process is conducted to remove the mask layer 44 on the first NMOS region 14, the first PMOS region 16, the second NMOS region 18, the second PMOS region 20, and the MOS capacitor region 22 and exposing the mask layer 42 underneath. It should be noted that since part of the mask layer 42 on the gate structure 32 on first NMOS region 14 was already exposed before removing of the mask layer 44 on top, part of the mask layer 42 or spacer 50 on the first NMOS region 14 is preferably removed during removal of the mask layer 44 while the mask layer 42 on the first PMOS region 16, the second NMOS region 18, the second PMOS region 20, and the MOS capacitor region 22 is not removed.

In other words, the overall thickness of the spacer 50 on the first NMOS region 14 at this stage is slightly less than the overall thickness of the mask layer 42 on the first PMOS region 16, the second NMOS region 18, the second PMOS region 20, and the MOS capacitor region 22. Preferably, the overall thickness of the spacer 50 or mask layer 42 on the first NMOS region 14 is reduced to 90-110 Angstroms or most preferably 100 Angstroms while the mask layer 42 on the first PMOS region 16, the second NMOS region 18, the second PMOS region 20, and the MOS capacitor region 22 is kept at 140-160 Angstroms or most preferably 150 Angstroms.

Figure 7:
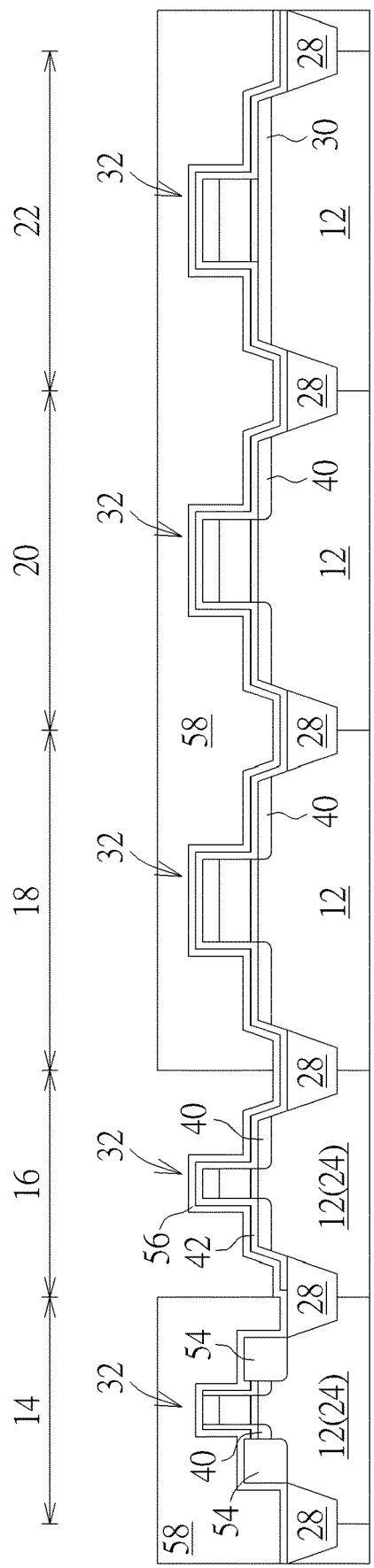

Next, as shown in FIG. 7, another mask layer 56 is formed on the gate structure 32 and substrate 12 on the first NMOS region 14 and the mask layer 42 on the first PMOS region 16, the second NMOS region 18, the second PMOS region 20, and the MOS capacitor region 22, in which the mask layer 56 preferably includes silicon nitride (SiN) and the thickness of the mask layer 56 could be between 40-60 Angstroms or most preferably 50 Angstroms, but not limited thereto. Next, a patterned mask 58 such as a patterned resist is formed on the first NMOS region 14, the second NMOS region 18, the second PMOS region 20, and the MOS capacitor region 22, in which the patterned mask 58 includes an opening exposing the surface of the mask layer 56 on the first PMOS region 16.

Figure 8:
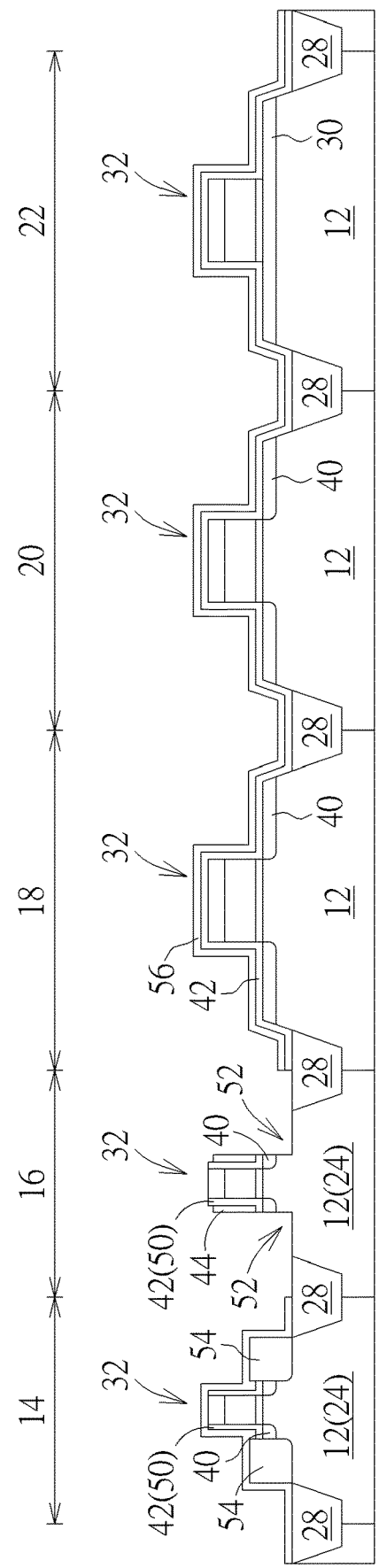

Next, as shown in FIG. 8, one or more dry etching and/or wet etching process is conducted by using the patterned mask 58 as mask to remove part of the mask layer 56, part of the mask layer 42, and part of the substrate 12 or fin-shaped structure 24 on the first PMOS region 16 for forming a spacer 50 on sidewalls of the gate structure 32 and recesses 52 adjacent to two sides of the spacer 50, and the patterned mask 58 is removed thereafter. Similar to FIG. 5, the mask layer 42 or spacer 50 at this stage preferably includes a L-shape cross-section while the mask layer 56 includes an I-shape cross-section.

Figure 9:
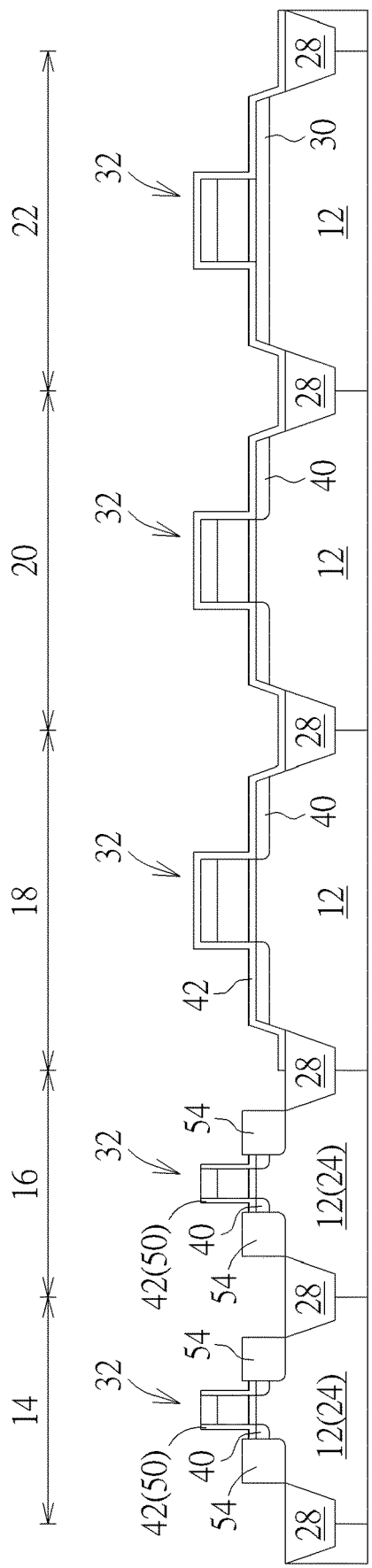

Next, as shown in FIG. 9, a selective epitaxial growth (SEG) process is conducted to form an epitaxial layer 54 made of silicon germanium (SiGe) in the recesses 52 for serving as a source/drain region. Next, another etching process is conducted to remove the mask layer 56 on the first NMOS region 14, the first PMOS region 16, the second NMOS region 18, the second PMOS region 20, and the MOS capacitor region 22 and exposing the mask layer 42 underneath. It should be noted that since part of the mask layer 42 on the gate structure 32 on first PMOS region 16 was already exposed before removing of the mask layer 56 on top, part of the mask layer 42 or spacer 50 on the first PMOS region 16 is preferably removed during removal of the mask layer 56 while the mask layer 42 on the first PMOS region 16, the second NMOS region 18, the second PMOS region 20, and the MOS capacitor region 22 is not removed.

Similar to FIG. 6, the overall thickness of the spacer 50 on the first PMOS region 16 at this stage is slightly less than the overall thickness of the mask layer 42 on the second NMOS region 18, the second PMOS region 20, and the MOS capacitor region 22. Preferably, the overall thickness of the spacer 50 or mask layer 42 on the first NMOS region 14 is slightly reduced to 90-110 Angstroms or most preferably 100 Angstroms or equal to the thickness of the spacer 50 on the first NMOS region 14. The mask layer 42 on the second NMOS region 18, the second PMOS region 20, and the MOS capacitor region 22 on the other hand is kept at 140-160 Angstroms or most preferably 150 Angstroms.

Figure 10:
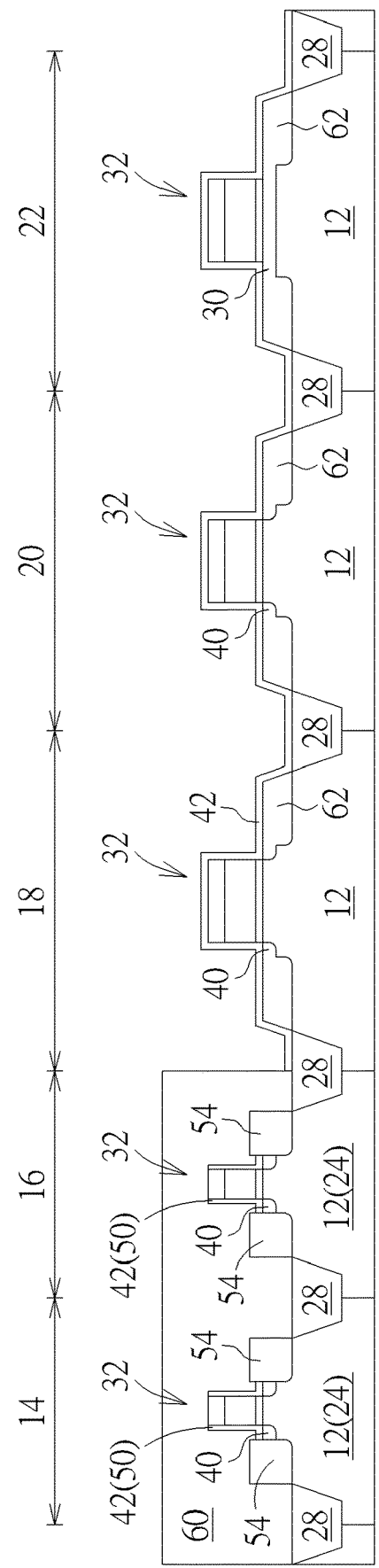

Next, as shown in FIG. 10, a patterned mask 60 such as a patterned resist is formed on the first NMOS region 14 and first PMOS region 16, one or more ion implantation process is conducted to form source/drain regions 62 or doped regions adjacent to two sides of the gate structures 32 on the second NMOS region 18, the second PMOS region 20, and the MOS capacitor region 22, and the patterned mask 60 is removed thereafter. Preferably, the source/drain regions 62 on the second NMOS region 18 and MOS capacitor region 22 are n+ regions while the source/drain region 62 on the second PMOS region 20 is a p+ region, the source/drain region 62 and the doped region 30 on the MOS capacitor region 22 include same conductive type, and the top surface of the epitaxial layers 54 on the first NMOS region 14 and first PMOS region 16 is slightly higher than the top surface of the source/drain regions 62 on the second NMOS region 18, the second PMOS region 20, and the MOS capacitor region 22.

Figure 11:
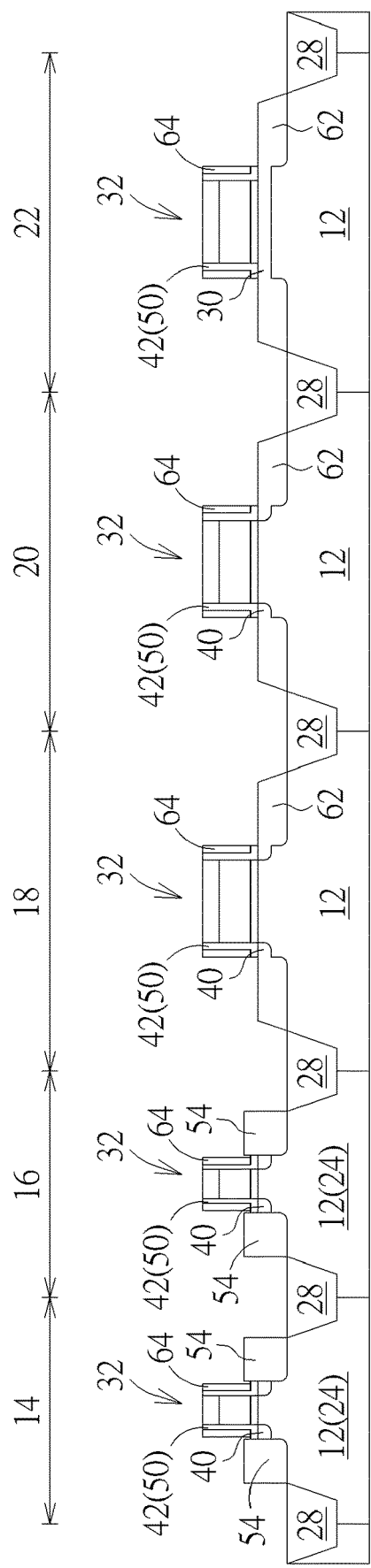

Next, as shown in FIG. 11, another mask layer (not shown) is formed on the gate structures 32 on the first NMOS region 14 and first PMOS region 16 and the mask layer 42 on the second NMOS region 18, second PMOS region 20, and MOS capacitor region 22, and then an etching back process is conducted to remove part of the mask layer and part of the mask layer 42 on the second NMOS region 18, the second PMOS region 20, and the MOS capacitor region 22 for forming a spacer 64 on sidewalls of each gate structure 32 on the first NMOS region 14 and first PMOS region 16 and at the same time forming a spacer 50 and spacer 64 adjacent to each of the gate structures 32 on the second NMOS region 18, the second PMOS region 20, and the MOS capacitor region 22.

Preferably, the overall thickness of the spacer 50 or mask layer 42 on each of the first NMOS region 14 and first PMOS region 16 at this stage is between 90-110 Angstroms or most preferably 100 Angstroms, the overall thickness of the spacer 50 on each of the second NMOS region 18, the second PMOS region 20, and the MOS capacitor region 22 is between 140-160 Angstroms or most preferably 150 Angstroms, and the thickness of the spacer 64 on the first NMOS region 14, the first PMOS region 16, the second NMOS region 18, the second PMOS region 20, and the MOS capacitor region 22 is between 40-60 Angstroms or most preferably 50 Angstroms.

Figure 12:
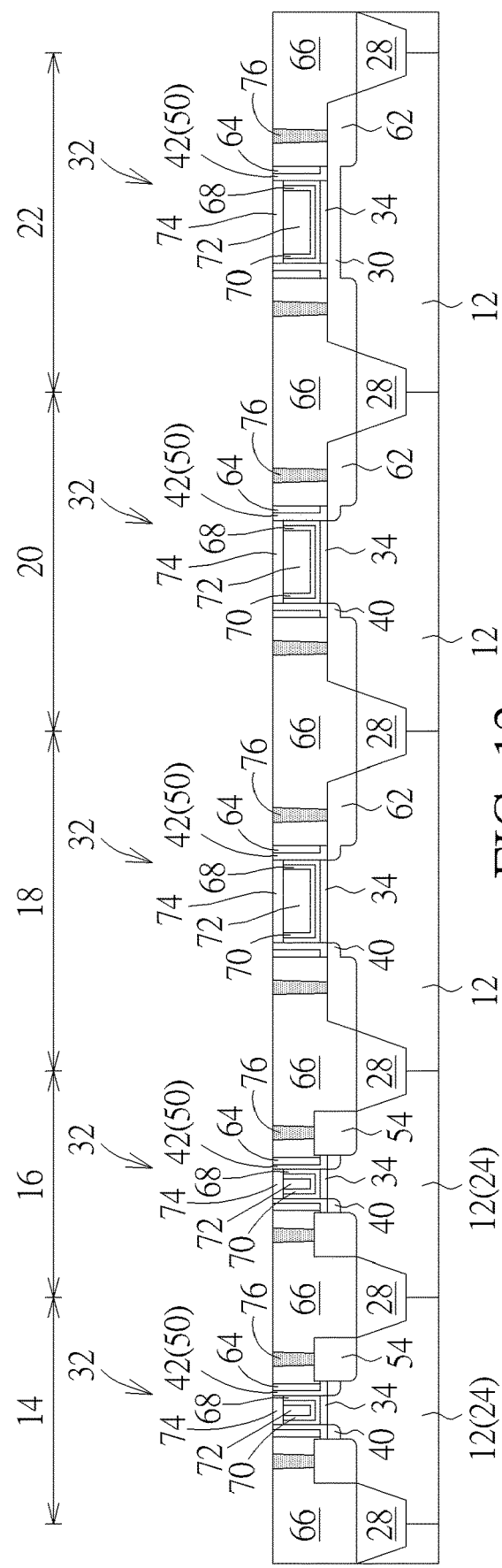

Next, as shown in FIG. 12, a selective contact etch stop layer (CESL) (not shown) could be formed on the substrate 12 surface to cover the gate structures 32 on each region, and an interlayer dielectric (ILD) layer 66 is formed on the CESL afterwards. Next, a planarizing process such as a chemical mechanical polishing (CMP) process is conducted to remove part of the ILD layer 66 and part of the CESL so that the top surfaces of the hard mask 38 and ILD layer 66 are coplanar.

Next, a replacement metal gate (RMG) process is conducted to transform the gate structures 32 on each region into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the hard masks 32 and the gate material layers 36 from gate structures 32 for forming recesses (not shown) in the ILD layer 66. Next, a high-k dielectric layer 68, a work function metal layer 70, and a low resistance metal layer 72 are formed in the recesses, and a planarizing process such as CMP is conducted to remove part of low resistance metal layer 72, part of work function metal layer 70, and part of high-k dielectric layer 68 so that the top surfaces of the U-shape high-k dielectric layer 68, the U-shape work function metal layer 70, the low resistance metal layer 72, and the ILD layer 66 are coplanar. Preferably, the high-k dielectric layer 68, the work function metal layer 70, and the low resistance metal layer 72 altogether constitute a gate electrode for each of the transistors or devices.

In this embodiment, the high-k dielectric layer 68 is preferably selected from dielectric materials having dielectric constant (k value) larger than 4. For instance, the high-k dielectric layer 68 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 70 is formed for tuning the work function of the metal gate in accordance with the conductivity of the device. For an NMOS transistor, the work function metal layer 70 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 70 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 70 and the low resistance metal layer 72 may include titanium (Ti), titanium nitride (TiN), tantalum (Ta) or tantalum nitride (TaN). Furthermore, the material of the low-resistance metal layer 72 may include copper (Cu), aluminum (Al), titanium aluminum (TiAl), cobalt tungsten phosphide (CoWP) or any combination thereof. Since the transformation of dummy gates into metal gates through RMG process is well known to those skilled in the art, the details of which are not explained herein for the sake of brevity. Next, part of the high-k dielectric layer 68, part of the work function metal layer 70, and part of the low resistance metal layer 72 are removed to form recesses (not shown), and a hard mask 74 is formed into each of the recesses so that the top surfaces of the hard masks 74 and the ILD layer 66 are coplanar. Preferably the hard masks 74 could include $SiO_2$, SiN, SiON, SiCN, or combination thereof.

Next, a photo-etching process is conducted by using a patterned mask (not shown) as mask to remove part of the ILD layer 66 and part of the CESL adjacent to the gate structures 32 for forming contact holes (not shown) exposing the epitaxial layer 54 and source/drain regions 62. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 76 electrically connecting the epitaxial layer 54 and source/drain regions 62. This completes the fabrication of a semiconductor device according to an embodiment of the present invention.

Typically, logic devices and low noise devices in current analog circuits are all fabricated under FinFET architecture, in which the overall performance of the analog circuit is mainly determined by Q-value of the transistors and capacitance of the MOS capacitors. Under the FinFET architecture, the Q-value of FinFETs in low noise devices are usually relied upon the number and heights of fin-shaped structures while the capacitance of the MOS capacitors are determined by the length of the capacitor as well as the distance ratio between the capacitors. Nevertheless, satisfactory performance from either one could not be achieved under the current architecture. To resolve this issue, the present invention replaces the fin NMOS transistors, fin PMOS transistors, and MOS transistors in low noise device fabricated under FinFET architecture with planar NMOS transistors, planar PMOS transistors, and planar MOS capacitors, in which the Q-value of planar transistors in low noise devices are relied upon widths of the gate structures while the capacitance of the MOS capacitors are determined by the overlapped area between metal gate and doped region or channel. By following this approach for fabricating analog circuits, it would be desirable to improve gate density in the logic devices and overall performance of the low noise devices effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate having a first NMOS region, a first PMOS region, a second NMOS region, a second PMOS region, and a MOS capacitor region;
   forming a fin NMOS transistor on the first NMOS region;
   forming a fin PMOS transistor on the first PMOS region;
   forming a planar NMOS transistor on the second NMOS region;
   forming a planar PMOS transistor on the second PMOS region; and
   forming a planar MOS capacitor on the MOS capacitor region.

2. The method of claim 1, further comprising:
   forming a first doped region in the substrate on the MOS capacitor region;
   forming a first gate structure on the first NMOS region, a second gate structure on the first PMOS region, a third gate structure on the second NMOS region, a fourth gate structure on the second PMOS region, and a fifth gate structure on the MOS capacitor region;
   forming a first spacer adjacent to the first gate structure;
   forming a first source/drain region adjacent to the first spacer;
   forming a second spacer adjacent to the second gate structure;
   forming a second source/drain region adjacent to the second spacer;
   forming a third source/drain region adjacent to the third gate structure;
   forming a fourth source/drain region adjacent to the fourth gate structure;
   forming a second doped region adjacent to the fifth gate structure;
   forming a third spacer adjacent to the first spacer;
   forming a fourth spacer adjacent to the second spacer;
   forming a fifth spacer and a sixth spacer adjacent to the third gate structure;
   forming a seventh spacer and an eight spacer adjacent to the fourth gate structure; and
   forming a ninth spacer and a tenth spacer adjacent to the fifth gate structure.

3. The method of claim 2, further comprising forming the fifth gate structure directly on the first doped region.

4. The method of claim 2, wherein the first doped region contacts the second doped region directly.

5. The method of claim 2, wherein the first doped region and the second doped region comprise same conductive type.

6. The method of claim 2, wherein a thickness of the first spacer is less than a thickness of the fifth spacer.

7. The method of claim 2, wherein a thickness of the second spacer is less than a thickness of the fifth spacer.

* * * * *